(12) United States Patent
Pilolli et al.

(10) Patent No.: US 11,079,946 B2
(45) Date of Patent: Aug. 3, 2021

(54) WRITE TRAINING IN MEMORY DEVICES

(71) Applicant: MICRON TECHNOLOGY, INC., Boise, ID (US)

(72) Inventors: Luigi Pilolli, L'Aquila (IT); Ali Feiz Zarrin Ghalam, Sunnyvale, CA (US); Guan Wang, San Jose, CA (US); Qiang Tang, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 181 days.

(21) Appl. No.: 16/171,442

(22) Filed: Oct. 26, 2018

(65) Prior Publication Data

US 2020/0133540 A1 Apr. 30, 2020

(51) Int. Cl.
*G06F 3/06* (2006.01)
*G11C 16/32* (2006.01)

(52) U.S. Cl.
CPC .......... *G06F 3/0632* (2013.01); *G06F 3/0604* (2013.01); *G06F 3/0659* (2013.01); *G06F 3/0679* (2013.01); *G11C 16/32* (2013.01)

(58) Field of Classification Search
CPC ....... G11C 7/222; G11C 7/106; G11C 7/1057; G11C 8/04; G11C 8/06; G11C 8/18; G11C 16/32
See application file for complete search history.

(56) References Cited

U.S. PATENT DOCUMENTS

| | | | |
|---|---|---|---|
| 6,691,214 B1* | 2/2004 | Li | G11C 7/02 711/167 |
| 6,735,709 B1* | 5/2004 | Lee | G11C 7/1051 713/401 |
| 6,763,444 B2* | 7/2004 | Thomann | G11C 7/22 702/89 |
| 7,167,966 B2 | 1/2007 | Cornelius et al. | |
| 7,983,094 B1 | 7/2011 | Roge et al. | |
| 9,275,706 B2* | 3/2016 | Tam | G06F 13/1689 |
| 9,312,022 B1* | 4/2016 | Tang | G11C 7/22 |
| 9,530,473 B2 | 12/2016 | Mazumder | |
| 9,865,317 B2 | 1/2018 | Ishibashi et al. | |
| 10,688,210 B2* | 6/2020 | Shatalov | A61L 2/24 |

(Continued)

FOREIGN PATENT DOCUMENTS

| | | |
|---|---|---|
| CN | 104134454 A | 11/2014 |
| TW | 495966 | 7/2002 |

(Continued)

OTHER PUBLICATIONS

International Search Report and Written Opinion of the International Searching Authority for Application No. PCT/US2019/051625 dated Jan. 3, 2020 (13 pages).

*Primary Examiner* — Ramon A. Mercado

(74) *Attorney, Agent, or Firm* — Dicke, Billig & Czaja, PLLC

(57) ABSTRACT

A memory device includes a plurality of input/output (I/O) nodes, a circuit, a latch, a memory, and control logic. The plurality of I/O nodes receive a predefined data pattern. The circuit adjusts a delay for each I/O node as the predefined data pattern is received. The latch latches the data received on each I/O node. The memory stores the latched data. The control logic compares the stored latched data to an expected data pattern and sets the delay for each I/O node based on the comparison.

19 Claims, 14 Drawing Sheets

(56) References Cited

U.S. PATENT DOCUMENTS

| | | | |
|---|---|---|---|
| 10,689,682 B2* | 6/2020 | Ono | C12P 19/18 |
| 2003/0167417 A1* | 9/2003 | To | G11C 7/222 |
| | | | 713/500 |
| 2006/0268632 A1* | 11/2006 | Schnell | G01R 31/31725 |
| | | | 365/194 |
| 2009/0310433 A1* | 12/2009 | Caltagirone | G06F 13/4291 |
| | | | 365/233.13 |
| 2010/0180143 A1* | 7/2010 | Ware | G11C 29/028 |
| | | | 713/600 |
| 2012/0051161 A1* | 3/2012 | Grunzke | G11C 8/18 |
| | | | 365/194 |
| 2012/0087194 A1* | 4/2012 | Oh | G11C 7/1093 |
| | | | 365/189.16 |
| 2014/0177377 A1* | 6/2014 | Kumar | G11C 29/023 |
| | | | 365/233.12 |
| 2015/0181905 A1* | 7/2015 | Fujimoto | A23D 9/04 |
| | | | 554/83 |
| 2015/0248925 A1 | 9/2015 | Kashyap et al. | |
| 2016/0096854 A1* | 4/2016 | Fujimoto | A23D 9/013 |
| | | | 514/784 |
| 2016/0314822 A1* | 10/2016 | Yeung | G11C 5/02 |
| 2020/0187521 A1* | 6/2020 | Kachichian | A23G 3/48 |
| 2020/0190449 A1* | 6/2020 | Hakim | A61K 31/198 |
| 2020/0197465 A1* | 6/2020 | Klele | A61K 36/185 |
| 2020/0198883 A1* | 6/2020 | Menendez | B65D 85/60 |

FOREIGN PATENT DOCUMENTS

| | | |
|---|---|---|
| TW | 200525349 A | 8/2005 |
| TW | 201104682 A | 2/2011 |
| TW | 201415480 A | 4/2014 |
| WO | 2007/106766 A3 | 9/2007 |

* cited by examiner

WRITE TRAINING IN MEMORY DEVICES

TECHNICAL FIELD

The present disclosure relates generally to write training in integrated circuit devices. In particular, in one or more embodiments, the present disclosure relates to receiver write training in a memory device.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, tablet computers, digital cameras, digital media players, cellular telephones, solid state drives and removable memory modules, and the uses are growing.

There may be skew between data signals written to a memory device from a host controller. The skew reduces the setup and hold time for latching the data into the memory device and may result in data errors. A host controller may implement a write training sequence in which the host controller executes several write-read cycles and adjusts input timing parameters to optimize the write path. This write training sequence may require the host controller to have advanced capabilities (e.g., edge adjustments). In addition, the write training sequence is performed on a single memory die at a time. Therefore, to keep the host controller complexity low, often the same setup is shared across all the memory dies of the same channel resulting in a mitigation of channel distortion only, and not mitigation of die to die variations.

For the reasons stated above, and for other reasons stated below which will become apparent to those skilled in the art upon reading and understanding the present specification, there is a need in the art for alternative methods for write training and system and apparatus to perform such methods.

DETAILED DESCRIPTION

Figure 1:
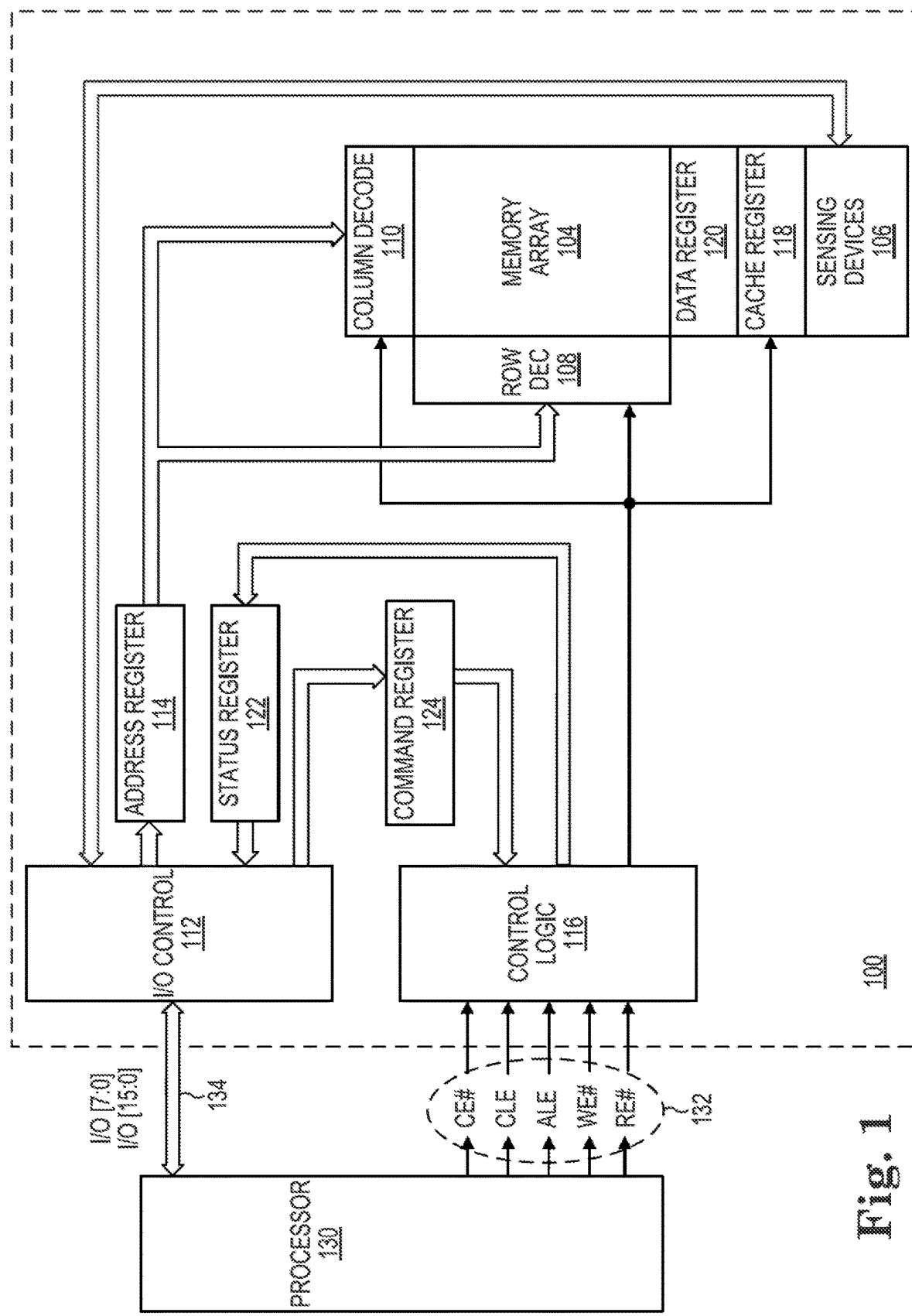
FIG. 1 is a simplified block diagram of one embodiment of a memory device in communication with a processor as part of an electronic system.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

A host controller may need advanced capabilities (e.g., edge adjustments) to implement a write training sequence such that the data latched within a memory device is aligned. In addition, the write training sequence is performed on a single memory die at a time. Therefore, to keep the host controller complexity low, often the same setup is shared across all the memory dies of the same channel resulting in a mitigation of channel distortion only, and not mitigation of die to die variations. Accordingly, this disclosure describes embodiments for implementing write training within an integrated circuit (e.g., memory die) instead of in the host controller. The write training disclosed herein may be applied to several memory devices at the same time and allows an accurate edge adjustment configuration without the need for the host controller to store any information. In addition, the write training disclosed herein may be used to implement a fast trim-by-die procedure, thereby saving test time.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, tablet computers, digital cameras, digital media players, digital recorders, games, appliances, vehicles, wireless devices, cellular telephones and the like. The processor 130, e.g., a controller external to the memory device 100, may be a memory controller or other external host device.

Memory device 100 may implement receiver write training to adjust trims used to align input data for latching within memory device 100. As will be described in more detail below, memory device 100 may implement write training in two phases. In the first phase, using a timing alignment hardware loop, a real time sweep of a delay value used for edge adjustment may be performed during a data input burst. In the second phase, a firmware algorithm may retrieve data written to a memory (e.g., cache register) during the previous data input burst, measure DQ/DQS skew, and select internal delays to facilitate an improvement in (e.g., maximize) the data window.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes I/O control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. I/O control circuitry 112 and control logic 116 may implement the write training disclosed herein.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from sensing devices 106 to the cache register 118. The data is then passed from the cache register 118 to data register 120 for transfer to the array of memory cells 104; then new data is latched in the cache register 118 from sensing devices 106, which receive the new data from the I/O control circuitry 112. During a read operation, data is passed from the cache register 118 to sensing devices 106, which pass the data to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE #, a command latch enable CLE, an address latch enable ALE, a write enable WE #, and a read enable RE #. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118 through sensing devices 106. The data are subsequently written into data register 120 for programming the array of memory cells 104. For another embodiment, cache register 118 may be omitted, and the data are written directly into data register 120 through sensing devices 106. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
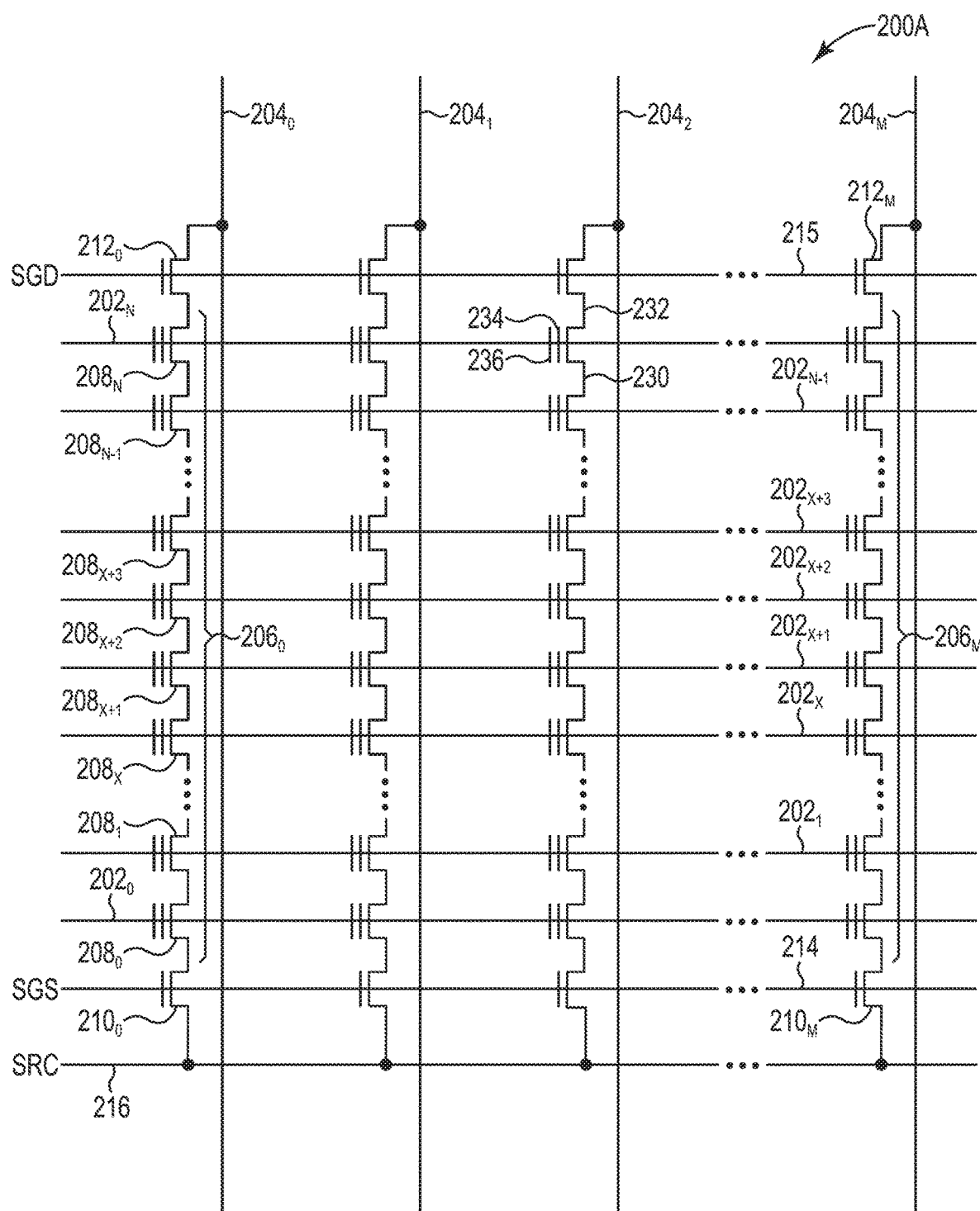
FIGS. 2A-2B are schematic diagrams of portions of an array of memory cells as could be used in a memory device of the type described with reference to FIG. 1.

FIG. 2A is a schematic of a NAND memory array 200A, e.g., as a portion of array of memory cells 104. Memory array 200A includes access lines, such as word lines $202_0$ to $202_N$, and data lines, such as bit lines $204_0$ to $204_M$. The word lines 202 may be coupled to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_m$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 2A might be a quasi-two-dimensional memory array and might have a generally planar structure, e.g., where the common source 216, strings 206 and bit lines 204 extend in substantially parallel planes. Alternatively, the memory array in FIG. 2A might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 2A. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$, $204_5$ are not expressly depicted in FIG. 2A, it is apparent from the figure that the bit lines 204 of the array of memory cells 200A may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Figure 2B:
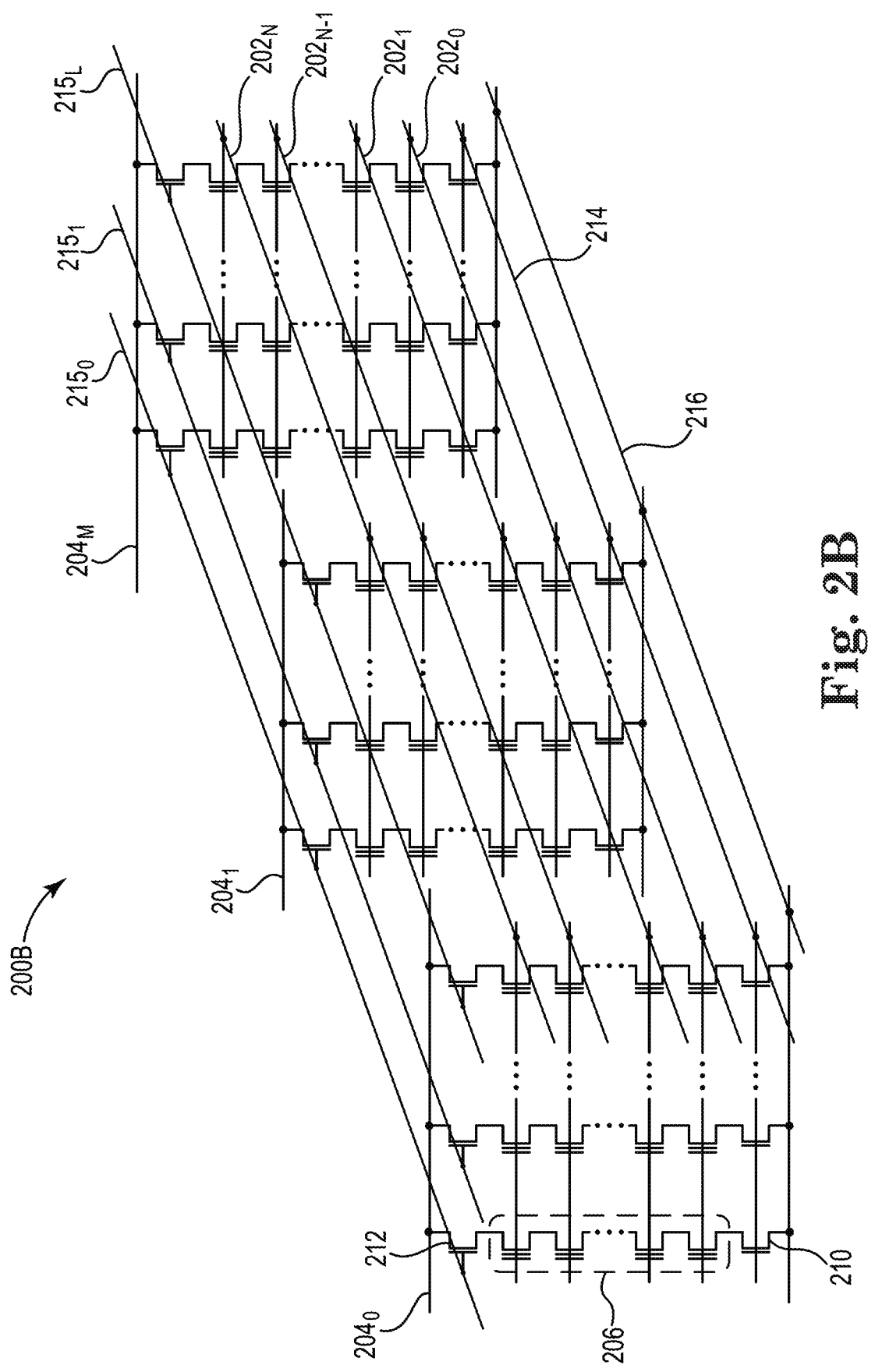

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines 215० -215L to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Although the examples of FIGS. 2A and 2B are discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

Figure 3:
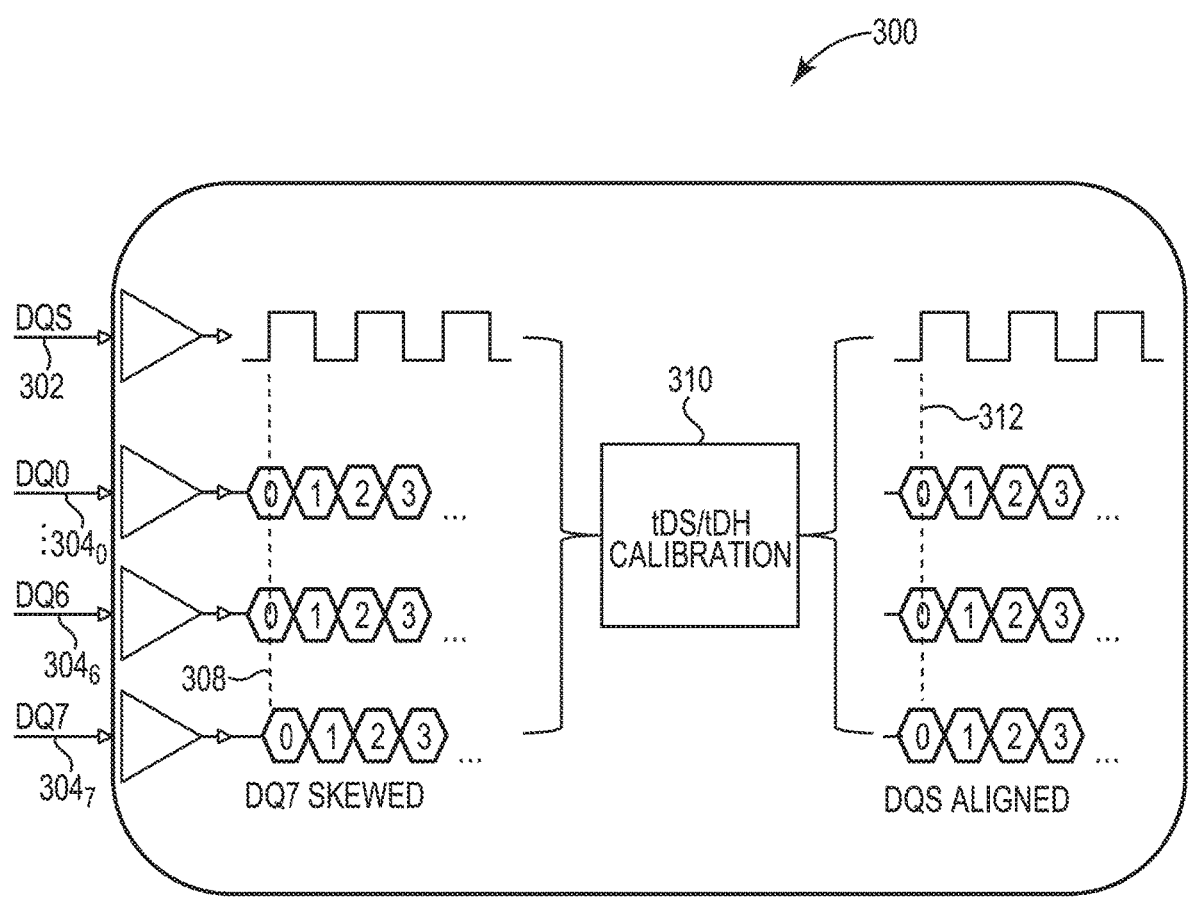
FIG. 3 illustrates one embodiment of receiver write training.

FIG. 3 illustrates one embodiment of receiver write training 300. Receiver write training 300 may receive as input a data strobe (DQS) signal on a DQS signal node 302 and a plurality of data signals DQ0 to DQ7 on a plurality of data signal nodes $304_0$ to $304_7$, respectively. Prior to receiver write training, the DQ0 to DQ7 signals may include skew as shown for example for DQ7 at 308. Receiver write training 300 may fix DQ-to-DQ skew on writes to a memory device. During receiver write training, the memory device may measure the DQS-to-DQ timing and internally adjust DQ signal and/or DQS signal delays via trim changes as indicated by the calibration at 310. The trim changes may adjust the setup time (tDS) and hold time (tDH) margins to align the DQ signals. Thus, after receiver write training, the DQS signal may be aligned with each DQ0 to DQ7 signal as indicated at 312 and the data may be latched within the memory device in response to the DQS signal.

Figure 4:
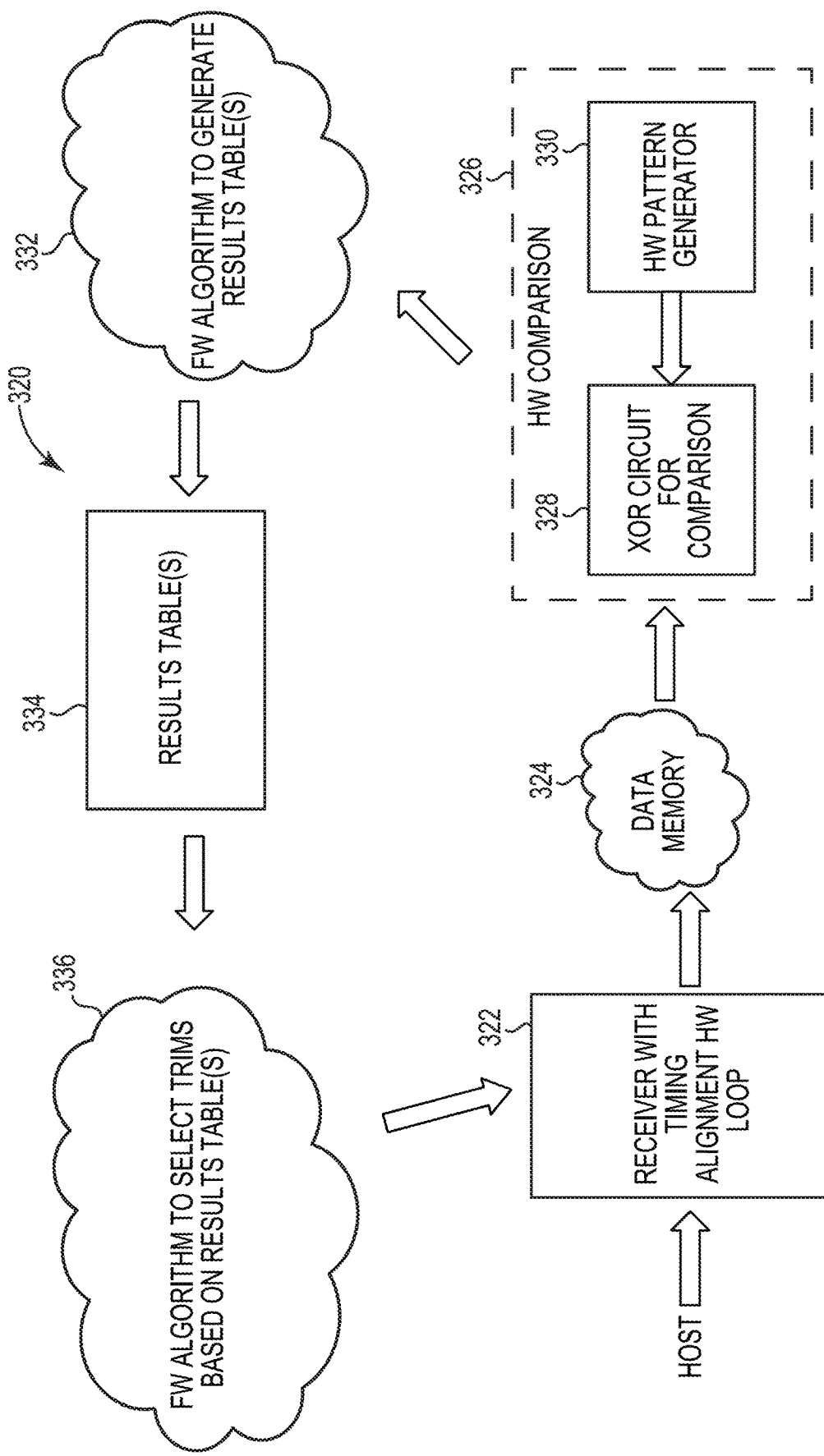
FIG. 4 is a block diagram illustrating one embodiment of a memory device for implementing receiver write training.

FIG. 4 is a block diagram illustrating one embodiment of a memory device 320 for implementing receiver write training. Memory device 320 may include a receiver 322 with a timing alignment hardware (HW) loop, a data memory 324, a hardware comparison circuit 326, a firmware algorithm 332 to generate results table(s), a results table(s) memory 334, and a firmware algorithm 336 to select trims.

As will be described in more detail below with reference to the following figures, during receiver write training receiver 322 may receive a data pattern on I/O (e.g., DQ) nodes and a data strobe signal on a data strobe (e.g., DQS) node from a host. Receiver 322 may adjust delays of the received data on each I/O node while the data is received. Receiver 322 may latch the delayed data in response to the data strobe signal and store the latched data in data memory 324.

Hardware comparison logic 326 may include an XOR circuit 328 and a hardware pattern generator 330. Hardware pattern generator 330 may generate an expected data pattern to match the data pattern provided by the host to the input of receiver 322. In other embodiments, hardware pattern generator 330 may be excluded and the expected data pattern may be stored in a memory (e.g., volatile memory, SRAM) of memory device 320. In either case, XOR circuit 328 may compare the data pattern stored in data memory 324 to the expected data pattern to provide a comparison result. In other embodiments, hardware comparison logic 326 may be excluded and the comparison of the data pattern stored in data memory 324 to the expected data pattern may be implemented in firmware logic of memory device 320.

From the comparison results, either from hardware comparison logic 326 or from firmware logic, firmware algorithm 332 may generate a results table or tables as will be described below with reference to FIG. 8. The result table or tables are stored in the results table(s) memory (e.g., volatile memory, SRAM) 334 of memory device 320. Based on the results table(s) stored in memory 334, firmware algorithm 336 may select the trims (i.e., delay settings) of receiver 322 to align data received on each I/O node for latching within receiver 322.

Figure 5:
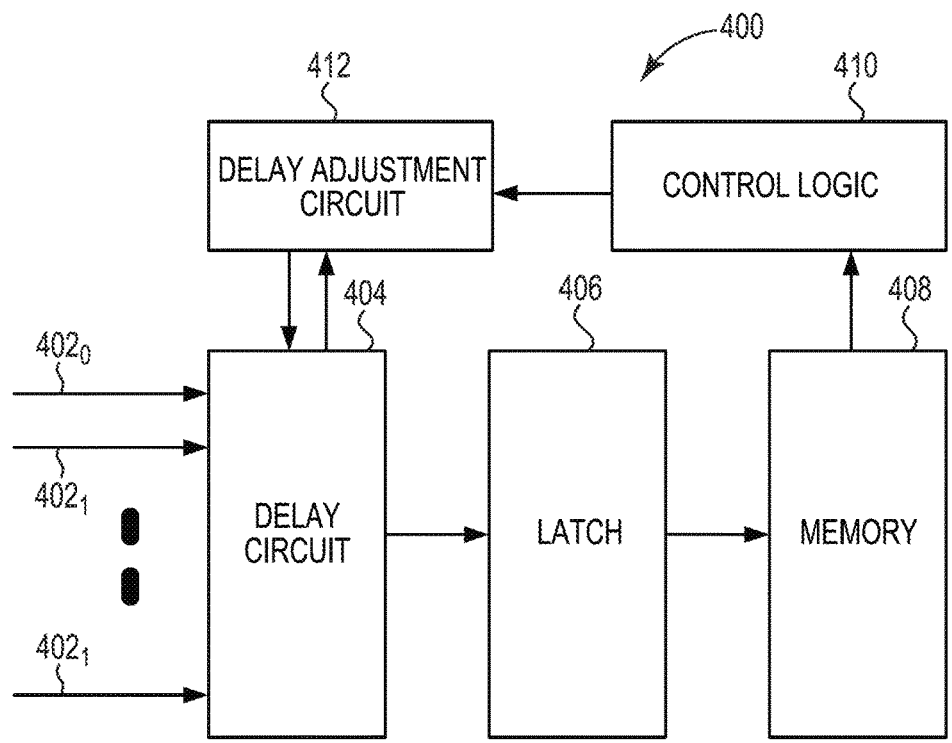
FIG. 5 is a block diagram illustrating another embodiment of a memory device for implementing receiver write training.

FIG. 5 is a block diagram illustrating another embodiment of a memory device 400 for implementing receiver write training. Memory device 400 may include a plurality of input/output (I/O) nodes $402_0$ to $402_I$, a delay circuit 404, a latch 406, a memory 408, control logic 410, and a delay adjustment circuit 412. I/O nodes $402_0$ to $402_I$ may be communicatively coupled to the input of delay circuit 404. The output of delay circuit 404 may be communicatively coupled to the input of latch 406. The output of latch 406 may be communicatively coupled to the input of memory 408. Memory 408 may be communicatively coupled to control logic 410. Control logic 410 may be communicatively coupled to delay adjustment circuit 412. Delay adjustment circuit 412 may be communicatively coupled to delay circuit 404.

During write training, the I/O nodes $402_0$ to $402_I$ may receive a predefined data pattern, such as from a host. Delay adjustment circuit 412 may adjust a delay of delay circuit 404 for each I/O node as the predefined data pattern is received. In one embodiment, delay adjustment circuit 412 may include a state machine. Latch 406 may latch the data received on each I/O node $402_0$ to $402_I$ after the data is delayed by delay circuit 404. Memory 408 may store the latched data. In one embodiment, a deserializer (not shown) may convert serial data from the latch 406 to parallel data for storage in the memory 408. Control logic 410 may compare the stored latched data to an expected data pattern and set the delay (e.g., via delay adjustment circuit 412) for each I/O node $402_0$ to $402_I$ based on the comparison. In one embodiment, control logic 410 may compare the stored latched data to the expected data pattern to generate a table indicating which stored latched data matches the expected data pattern and which stored latched data does not match the expected data pattern. In this case, control logic 410 may set the delay for each I/O node $402_0$ to $402_I$ based on the table. After write training, data received on each I/O node $402_0$ to $402_I$ may be aligned when latched within latch 406.

Figure 6:
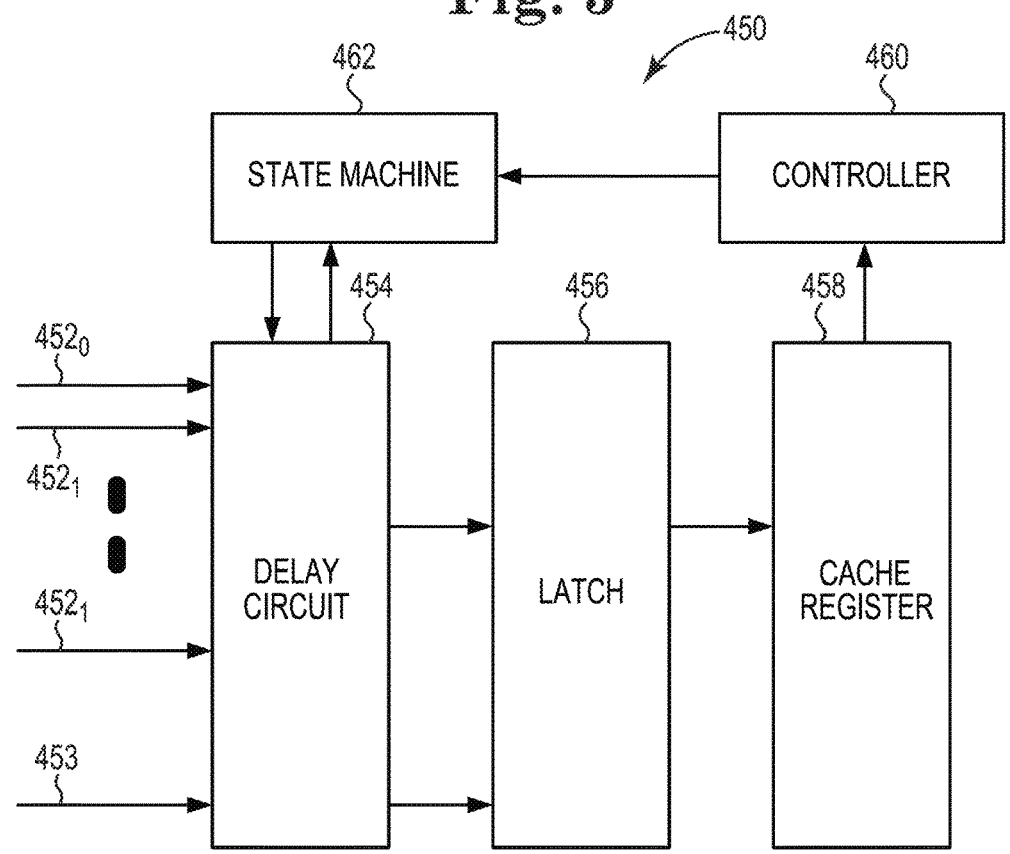
FIG. 6 is a block diagram illustrating another embodiment of a memory device for implementing receiver write training.

FIG. 6 is a block diagram illustrating another embodiment of a memory device 450 for implementing receiver write training. Memory device 450 may include a plurality of I/O nodes $452_0$ to $452_I$, a data strobe node 453, a delay circuit 454, a latch 456, a cache register 458, a controller 460, and a state machine 462. I/O nodes $452_0$ to $452_I$ and data strobe node 453 may be communicatively coupled to the input of delay circuit 454. The output of delay circuit 454 may be communicatively coupled to the input of latch 456. The output of latch 456 may be communicatively coupled to the input of cache register 458. Cache register 458 may be communicatively coupled to controller 460. Controller 460 may be communicatively coupled to state machine 462. State machine 462 may be communicatively coupled to delay circuit 454.

During write training, the I/O nodes $452_0$ to $452_I$ may receive a periodic predefined data pattern and the data strobe node 453 may receive a data strobe signal, such as from a host. Delay circuit 454 may delay the data received on each I/O node $452_0$ to $452_I$ based on a trim value for each I/O node $452_0$ to $452_I$. In one embodiment, delay circuit 454 may also delay the data strobe signal received on data strobe node 453 based on a trim value for the data strobe node. Latch 456 may latch the delayed data for each I/O node $452_0$ to $452_I$ in response to the data strobe signal. Cache register 458 may store the latched data. In one embodiment, a deserializer (not shown) may be coupled between the latch 456 and the cache register 458 to convert serial data from the latch 456 to parallel data for storage in the cache register 458. State machine 462 may change the trim value for each I/O node $452_0$ to $452_I$ after each period of the predefined data pattern is received. In one embodiment, state machine 462 may also change the trim value for the data strobe node 453 after a plurality of periods of the predefined data pattern is received.

Controller 460 may select the trim value for each I/O node $452_0$ to $452_I$ based on a comparison between the stored data and an expected data pattern for each I/O node $452_0$ to $452_I$. In one embodiment, an XOR circuit (not shown) may be used to compare the stored data to the expected data pattern for each I/O node $452_0$ to $452_I$. In one embodiment, controller 460 may include a pattern generator to generate the expected data pattern for each I/O node $452_0$ to $452_I$. Controller 460 may also select the trim value for the data strobe signal based on a comparison between the stored data and the expected data pattern for each I/O node $452_0$ to $452_I$. In one embodiment, controller 460 may select the trim value for each I/O node $452_0$ to $452_I$ to adjust the setup and hold time margin for each I/O node $452_0$ to $452_I$. After write training, data received on each I/O node $452_0$ to $452_I$ may be aligned when latched within latch 456 in response to the data strobe signal received on the data strobe node 453.

Figure 7:
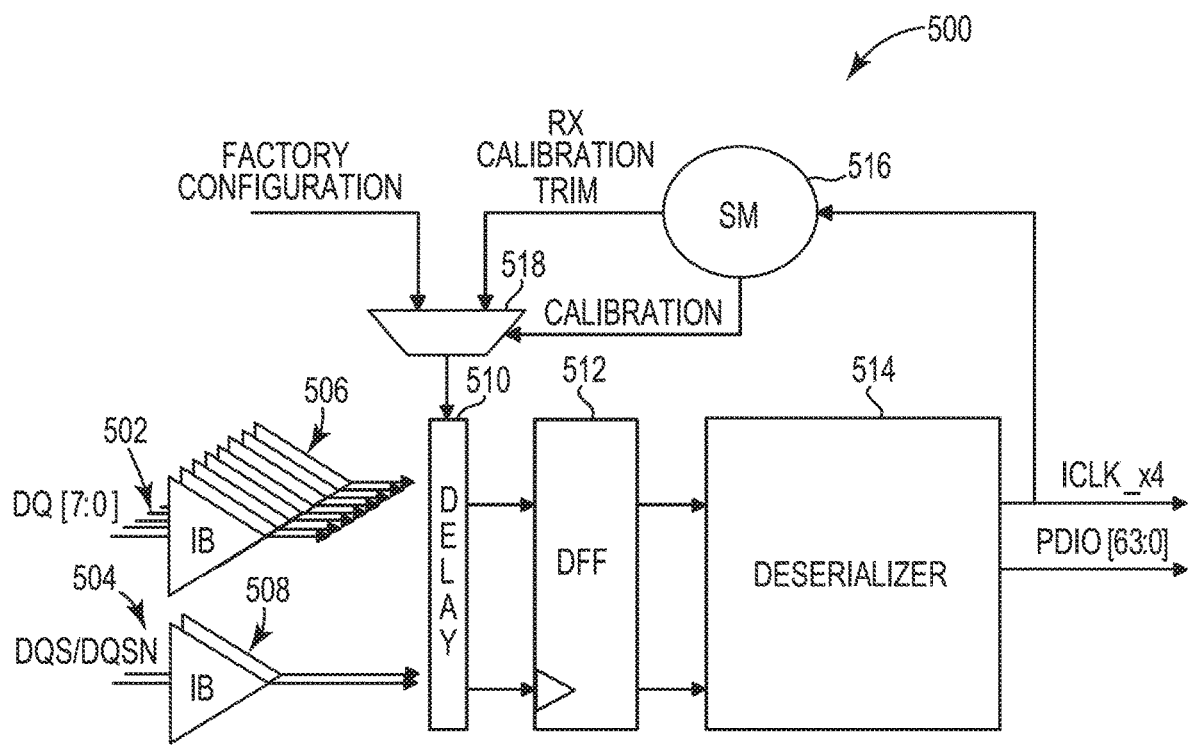
FIG. 7 is a schematic diagram illustrating one embodiment of a receiver with a timing alignment hardware loop.

FIG. 7 is a schematic diagram illustrating one embodiment of a receiver 500 with a timing alignment hardware loop. In one embodiment, receiver 500 may provide receiver 322 previously described and illustrated with reference to FIG. 4. In other embodiments, receiver 500 may provide a portion of memory device 400 (e.g., delay circuit 404, latch 406, delay adjustment circuit 412) of FIG. 5 or a portion of memory device 450 (e.g., delay circuit 454, latch 456, state machine 462) of FIG. 6. Receiver 500 may include data nodes DQ[7:0] as indicated at 502, data strobe nodes DQS/DQSN as indicated at 504, data input buffers 506, data strobe input buffers 508, a delay circuit 510, a D flip-flop (DFF) circuit 512, a deserializer 514, a state machine (SM) 516, and a multiplexer 518.

Each DQ[7:0] node 502 may be electrically coupled to an input of a corresponding input buffer 506. The output of each input buffer 506 may be electrically coupled to a corresponding input of delay circuit 510. DQS/DQSN nodes 504 may be electrically coupled to an input of a corresponding input buffer 508. The output of each input buffer 508 may be electrically coupled to a corresponding input of delay circuit 510. Outputs of delay circuit 510 corresponding to each DQ[7:0] may be electrically coupled to an input of a corresponding DFF of DFF circuit 512. Outputs of delay circuit 510 corresponding to DQS and DQSN may be electrically coupled to corresponding clock inputs of DFF circuit 512.

Outputs of DFF circuit 512 corresponding to each DQ[7:0] may be electrically coupled to corresponding inputs of deserializer 514. Outputs of DFF circuit 512 corresponding to DQS and DQSN may be electrically coupled to corresponding inputs (e.g., clock inputs) of deserializer 514. A clock output of deserializer 514 may be electrically coupled to an input of state machine 516 through a clock signal (ICLK_×4) signal path. A data output of deserializer 514 may be electrically coupled to a parallel data signal path (PDIO[63:0]). State machine 516 may be electrically coupled to a first input of multiplexer 518 through a calibration signal path and to a second input of multiplexer 518 through a receiver calibration trim signal path. A third input of multiplexer 518 may be electrically coupled to a factory configuration signal path.

During write training, a host may load a periodic (e.g., 32 bytes) pre-configured data pattern on DQ[7:0] nodes 502 and the DQS and DQSN signals on DQS/DQSN nodes 504. State machine 516 may set an initial trim value (via multiplexer 518 through the calibration signal path) for delay circuit 510 to delay each received DQ signal. Delay circuit 510 may delay each DQ signal by adjusting the DQ signal edges based on the trim value. The delayed DQ signals may be latched in DFF circuit 512 in response to the DQS/DQSN signals. Deserializer 514 may convert latched serial data from DFF circuit 512 to parallel data (i.e., PDIO[63:0]) for storage in a memory, such as data memory 324 of FIG. 4, memory 408 of FIG. 5, or cache register 458 of FIG. 6. In one embodiment, deserializer 514 may output every 64 bits of received data in parallel (i.e., 8 bits per DQ). State machine 516 may update the trim value for delay circuit 510 after each 32 bits of data is received for each DQ (i.e., after the 32 byte pre-configured data pattern is received). Therefore, state machine 516 may update the trim value for delay circuit 510 for each period (i.e., every 32 bytes) of the pre-configured data pattern. In one embodiment, the trims may be updated about every 26 ns. The received data for each trim value output by deserializer 514 may be saved in the memory.

In one embodiment, every other period of the pre-configured data pattern may be used to transition the trim value of delay circuit 510. In this case, the data stored in the memory during the trim transition may be ignored since the data may be invalid. In one embodiment, state machine 516 may sweep a predetermined number of trim values for each DQ. In one example, the predetermined number of trims equals 16. Accordingly, for this example, 32 bytes×16 trims=512 bytes of valid data may be stored in the memory. In the embodiment where every other period of the pre-configured data pattern is used for the trim transition, 64 bytes×16 trims=1024 bytes of data may be stored in the memory including 512 bytes of valid data and 512 bytes of invalid data.

In one embodiment, state machine 516 may set an initial trim value (via multiplexer 518) for delay circuit 510 to delay the DQS and DQSN signals. Delay circuit 510 may delay the DQS and DQSN signals by adjusting the DSQ and DQSN signal edges based on the trim value. In this case, the write training is implemented as described above but after the received data for each of the predetermined number of trims for each DQ has been stored, state machine 516 may update the trim value for the DQS and DQSN signals and the process repeats. Accordingly, in this case, 32 bytes×16 DQ trims×16 DSQ/DQSN trims=8192 bytes of valid data may be stored in the memory. In the embodiment where every other period of the pre-configured data pattern is used for the trim transition, 64 bytes×16 DQ trims×16 DSQ/DQSN trims=16384 bytes of data may be stored in the memory including 8192 bytes of valid data and 8192 bytes of invalid data.

Figure 8:
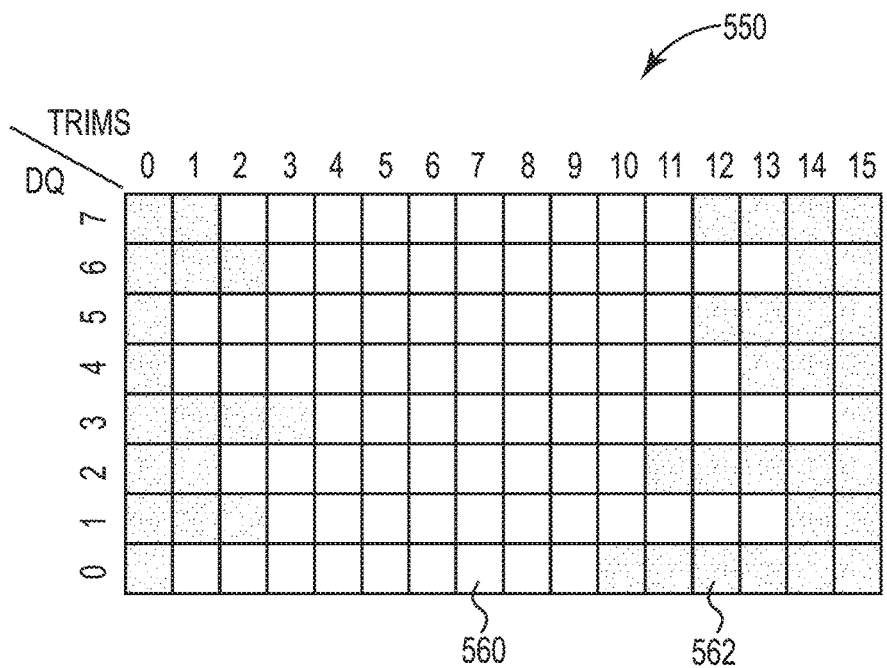
FIG. 8 is a table illustrating example pass/fail results for selecting trims in a memory device.

FIG. 8 is a table 550 illustrating example pass/fail results for selecting trims in a memory device. In one embodiment, table 550 may provide each results table 334 of FIG. 4. Table 550 may be generated by firmware algorithm 332 of FIG. 4, control logic 410 of FIG. 5, or controller 460 of FIG. 6. Table 550 may be generated based on the comparison of the received data stored in the memory (such as data memory 324 of FIG. 4, memory 408 of FIG. 5, or cache register 458 of FIG. 6) and the expected data.

Table 550 include a trim 0-15 (i.e., for a predetermined number of trims equal to 16) for each column and a DQ 0-7 (i.e., for 8 DQs) for each row. A pass for a trim/DQ point in the table is indicated for example at 560, and a fail for a trim/DQ point in the table is indicated for example at 562. A pass indicates that the received data for a DQ for the trim value matched the expected data for the DQ, and a fail indicates that the received data for a DQ for the trim value did not match the expected data for the DQ. One table 550 may be generated for each trim value of the data strobe signal (e.g., DQS/DQSN). Accordingly, for a predetermined number of trim values for the data strobe signal equal to 16, 16 tables 550 may be generated.

Table 550 may be used to select the trim value for each DQ. In one embodiment, table 550 may be used by firmware algorithm 336 of FIG. 4, control logic 410 of FIG. 5, or controller 460 of FIG. 6 to set the trim value for each DQ. The trim value for each DQ may be selected to maximize the setup and hold time margin for each DQ. For example, based on table 550, trim value 5 may be selected for DQ0, trim value 7 may be selected for DQ1, trim value 6 may be selected for DQ2, trim value 9 may be selected for DQ3, trim value 7 may be selected for DQ4, trim value 6 may be selected for DQ5, trim value 8 may be selected for DQ6, and trim value 6 may be selected for DQ7.

Referring back to FIG. 7, after write training state machine 516 may set the selected trim value for each DQ via multiplexer 518 through the receiver calibration trim signal path. Alternatively, the factory configuration may be used to select the trim value for each DQ via multiplexer 518 through the factory configuration signal path.

Figure 9:
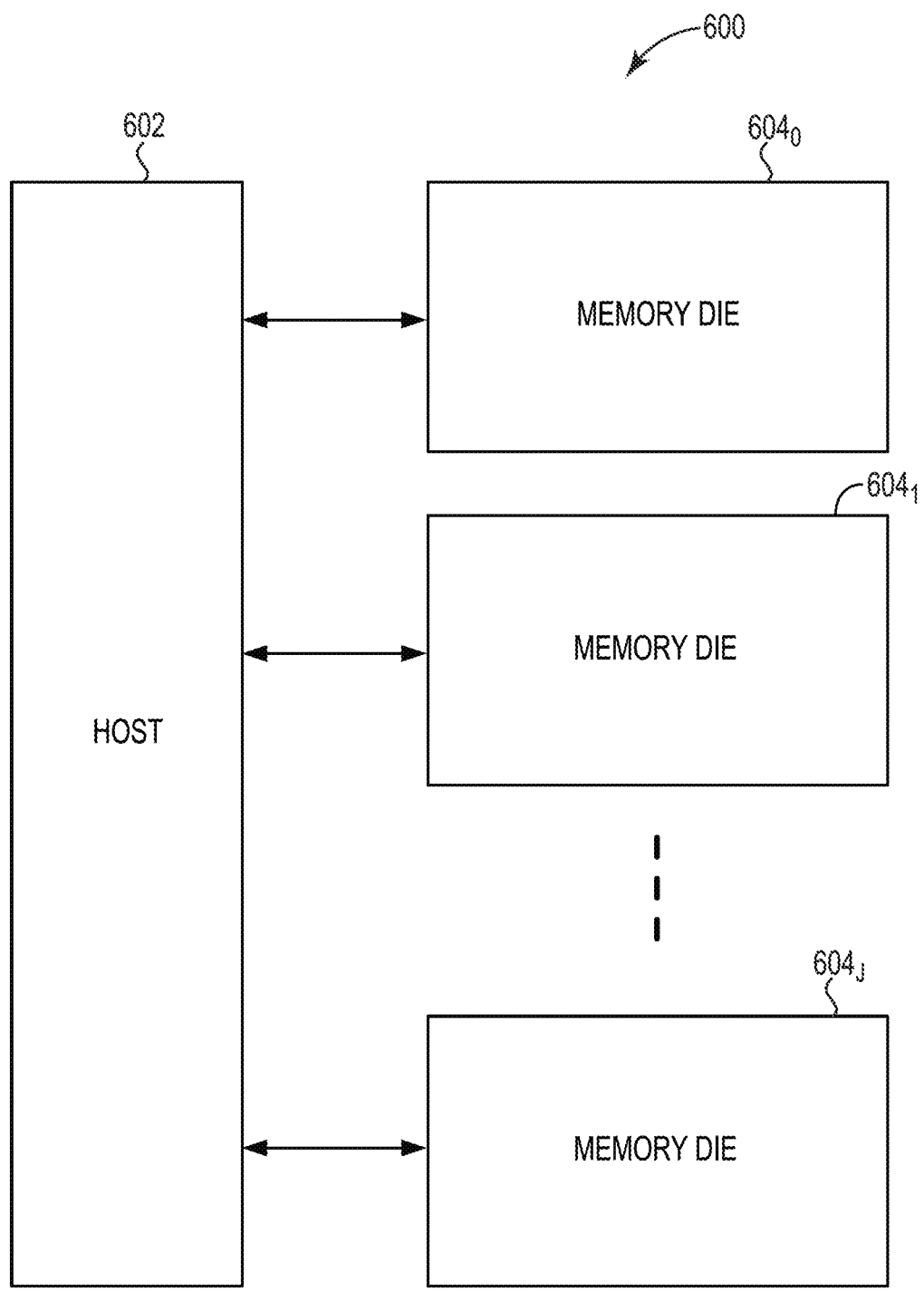
FIG. 9 is a block diagram illustrating one embodiment of a system including a host in communication with a plurality of memory dies.

FIG. 9 is a block diagram illustrating one embodiment of a system 600 including a host 602 in communication with a plurality of memory (e.g., NAND) dies 604₀ to 604_J. Each memory die 604₀ to 604_J may include a memory device 320 of FIG. 4, a memory device 400 of FIG. 5, or a memory device 450 of FIG. 6. During write training, host 602 may simultaneously provide a periodic predefined data pattern and a data strobe signal to each memory die $604_0$ to $604_J$. Accordingly, I/O nodes of each memory die $604_0$ to $604_J$ may receive the periodic predefined data pattern and a data strobe node of each memory die $604_0$ to $604_J$ may receive the data strobe signal. A delay circuit of each memory die $604_0$ to $604_J$ may adjust a delay of data received by each I/O node based on a trim value for each I/O node and adjust a delay of the data strobe signal based on a trim value for the data strobe node. A latch of each memory die $604_0$ to $604_J$ may latch the data received by each I/O node in response to the data strobe signal. A controller of each memory die $604_0$ to $604_J$ may compare the latched data to an expected data pattern and set the trim value for each I/O node and the trim value for the data strobe signal based on the comparison.

Figure 10A:
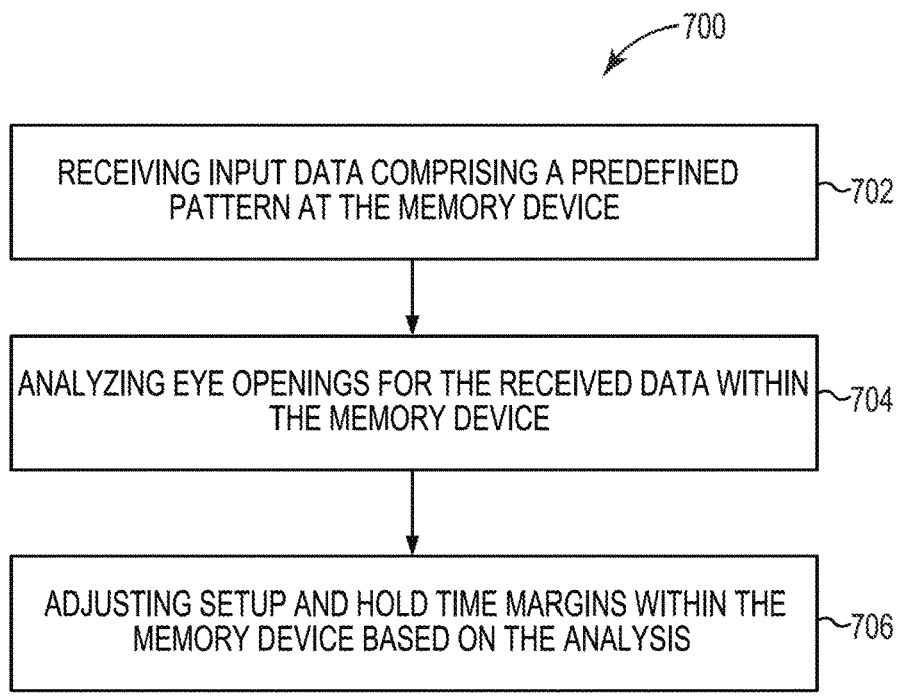
FIGS. 10A-10B are flow diagrams illustrating one embodiment of a method for write training in a memory device.
Figure 10B:
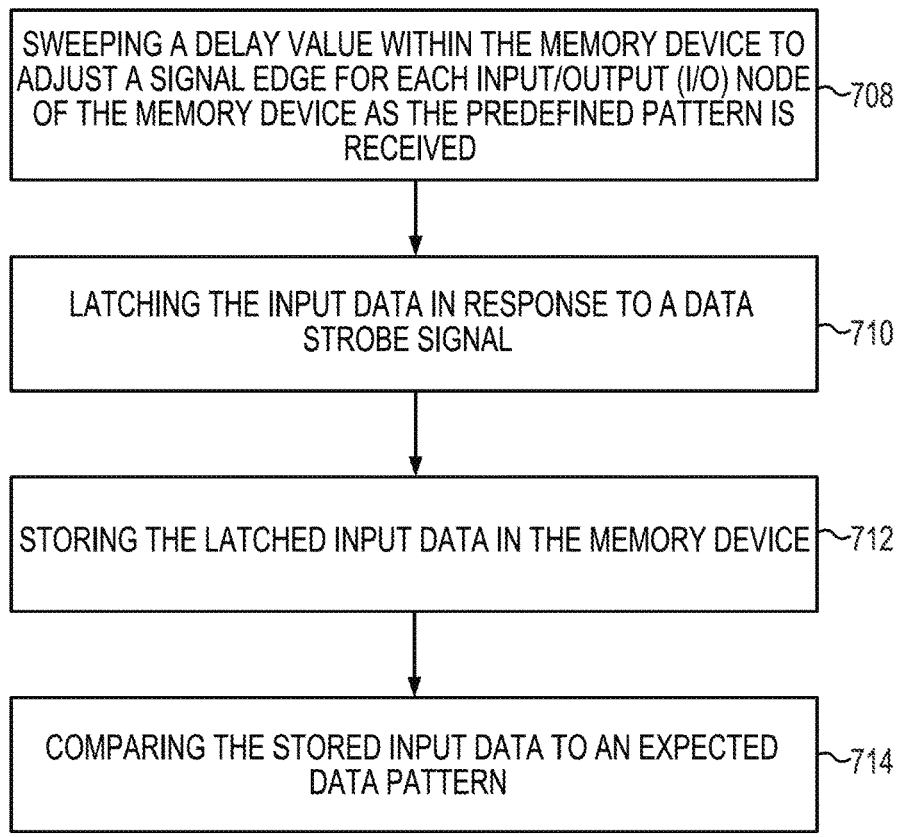

FIGS. 10A-10B are flow diagrams illustrating one embodiment of a method 700 for write training in a memory device. In one embodiment, method 700 may be implemented by memory device 320 of FIG. 4, memory device 400 of FIG. 5, or memory device 450 of FIG. 6. As illustrated in FIG. 10A, at 702 method 700 includes receiving input data comprising a predefined pattern at the memory device. At 704, method 700 includes analyzing eye openings for the received data within the memory device. At 706, method 700 includes adjusting setup and hold time margins within the memory device based on the analysis. In one embodiment, adjusting the setup and hold time margins of the memory device may include individually adjusting the setup and hold time margin for each I/O node of the memory device. Adjusting the setup and hold time margin for each I/O node of the memory device may also include aligning the latching of input data for each I/O node. Adjusting the setup and hold time margin for each I/O node of the memory device may also include individually setting a delay for each I/O node. Adjusting the setup and hold time margins of the memory device may also include adjusting an edge of a data strobe signal used to latch the input data.

FIG. 10B illustrates one embodiment for analyzing the eye openings for the received data. At 708, method 700 may further include sweeping a delay value within the memory device to adjust a signal edge for each I/O node of the memory device as the predefined pattern is received. At 710, method 700 may further include latching the input data in response to a data strobe signal. At 712, method 700 may further include storing the latched input data in the memory device. At 714, method 700 may further include comparing the stored input data to an expected data pattern. In this embodiment, adjusting the setup and hold time margins may include setting a delay value for each I/O node based on the comparison of the stored input data to the expected data pattern.

Figure 11A:
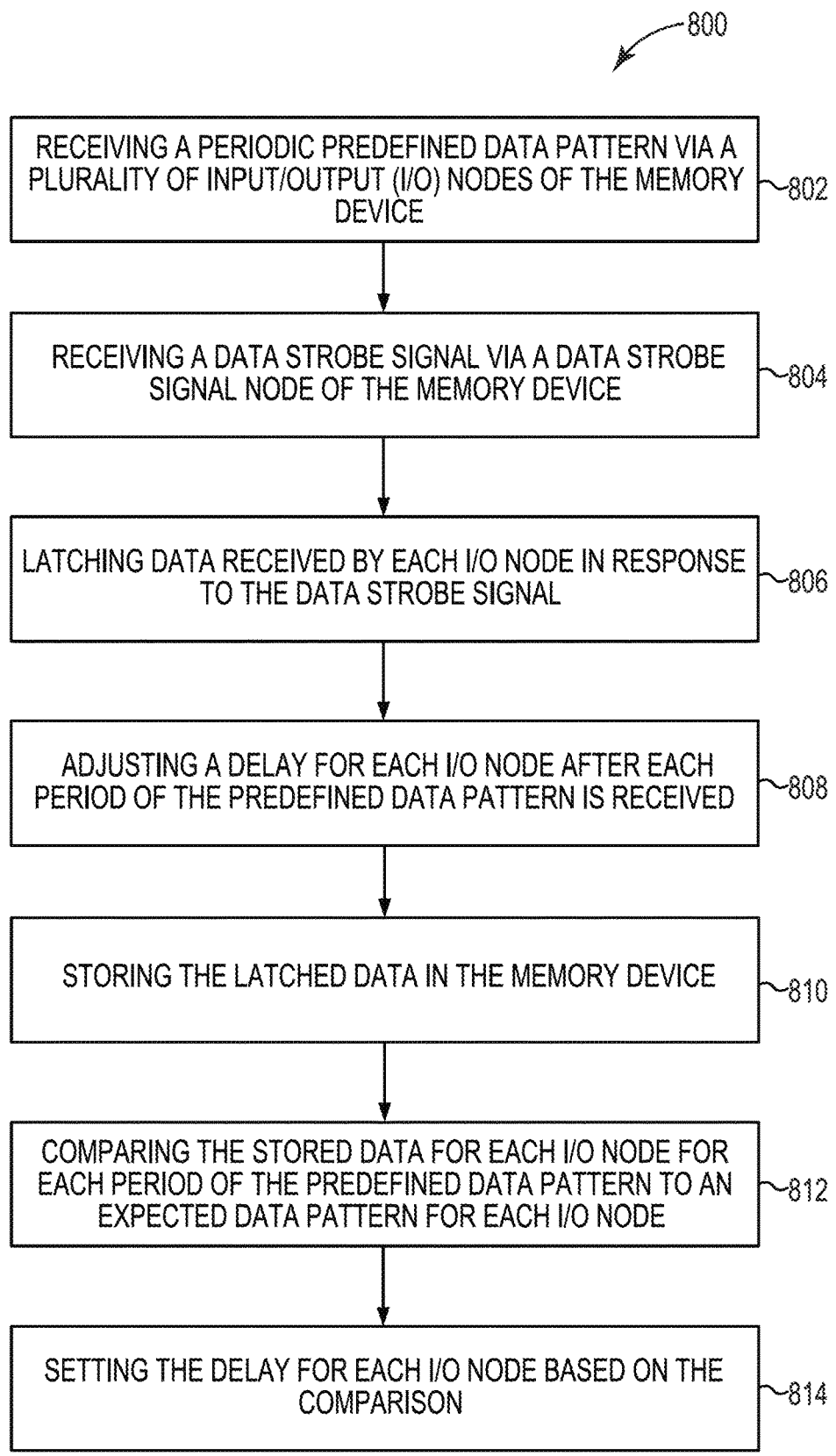
FIGS. 11A-11D are flow diagrams illustrating another embodiment of a method for write training in a memory device.

FIGS. 11A-11D are flow diagrams illustrating another embodiment of a method 800 for write training in a memory device. In one embodiment, method 800 may be implemented by memory device 320 of FIG. 4, memory device 400 of FIG. 5, or memory device 450 of FIG. 6. As illustrated in FIG. 11A, at 802 method 800 includes receiving a periodic predefined data pattern via a plurality of I/O nodes of the memory device. At 804, method 800 includes receiving a data strobe signal via a data strobe signal node of the memory device. At 806, method 800 includes latching data received by each I/O node in response to the data strobe signal. At 808, method 800 includes adjusting a delay for each I/O node after each period of the predefined data pattern is received. At 810, method 800 includes storing the latched data in the memory device. At 812, method 800 includes comparing the stored data for each I/O node for each period of the predefined data pattern to an expected data pattern for each I/O node. At 814, method 800 includes setting the delay for each I/O node based on the comparison. In one embodiment, setting the delay for each I/O node may include setting the delay for each I/O node to align the latching of data received by each I/O node.

Figure 11B:
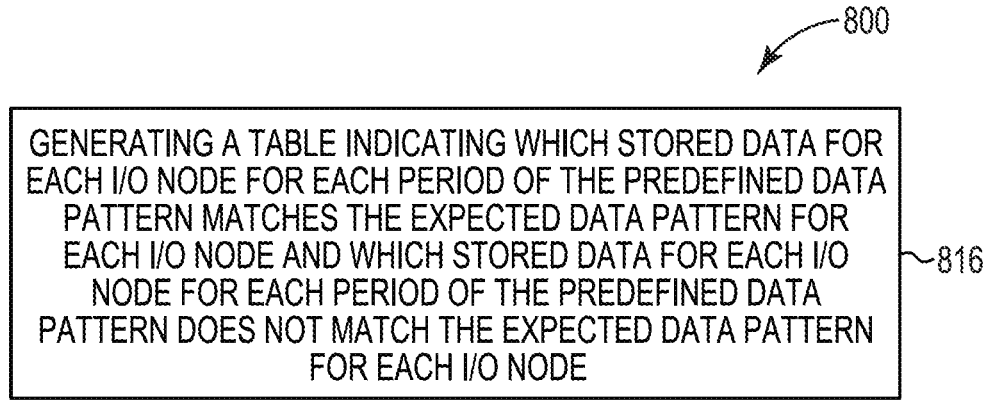

As illustrated in FIG. 11B, at 816 method 800 may further include generating a table indicating which stored data for each I/O node for each period of the predefined data pattern matches the expected data pattern for each I/O node and which stored data for each I/O node for each period of the predefined data pattern does not match the expected data pattern for each I/O node. In this embodiment, setting the delay for each I/O node may include setting the delay for each I/O node based on the table indicating which stored data for each I/O node for each period of the predefined data pattern matches the expected data pattern for each I/O node.

Figure 11C:
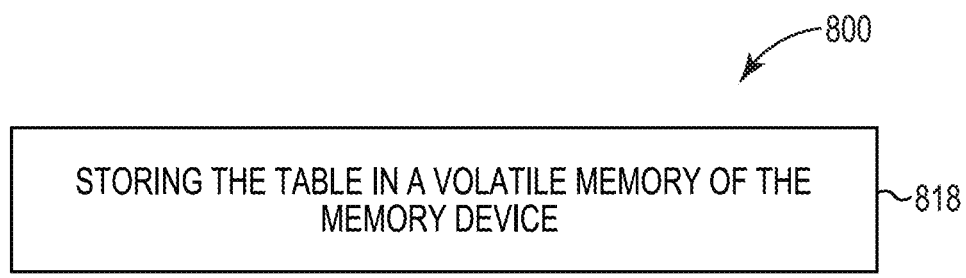
Figure 11D:
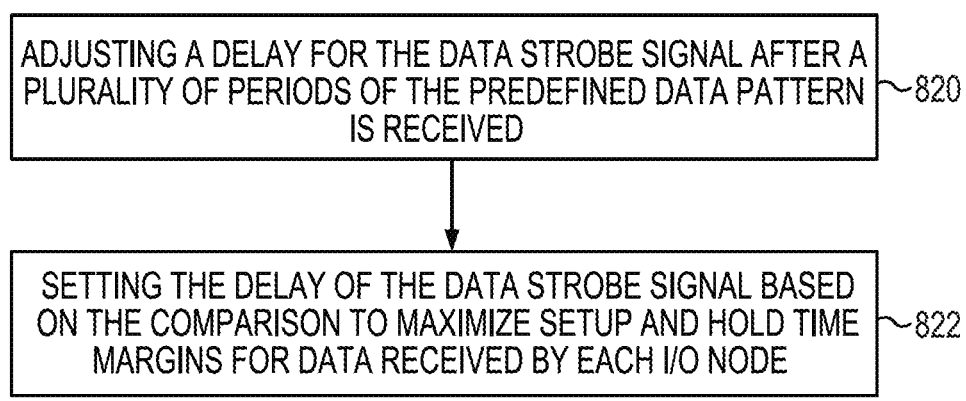

As illustrated in FIG. 11C, at 818 method 800 may further include storing the table in a volatile memory of the memory device. As illustrated in FIG. 11D, at 820 method 800 may further include adjusting a delay for the data strobe signal after a plurality of periods of the predefined data pattern is received. At 822, method 800 may further include setting the delay of the data strobe signal based on the comparison to maximize setup and hold time margins for data received by each I/O node.

Figure 12A:
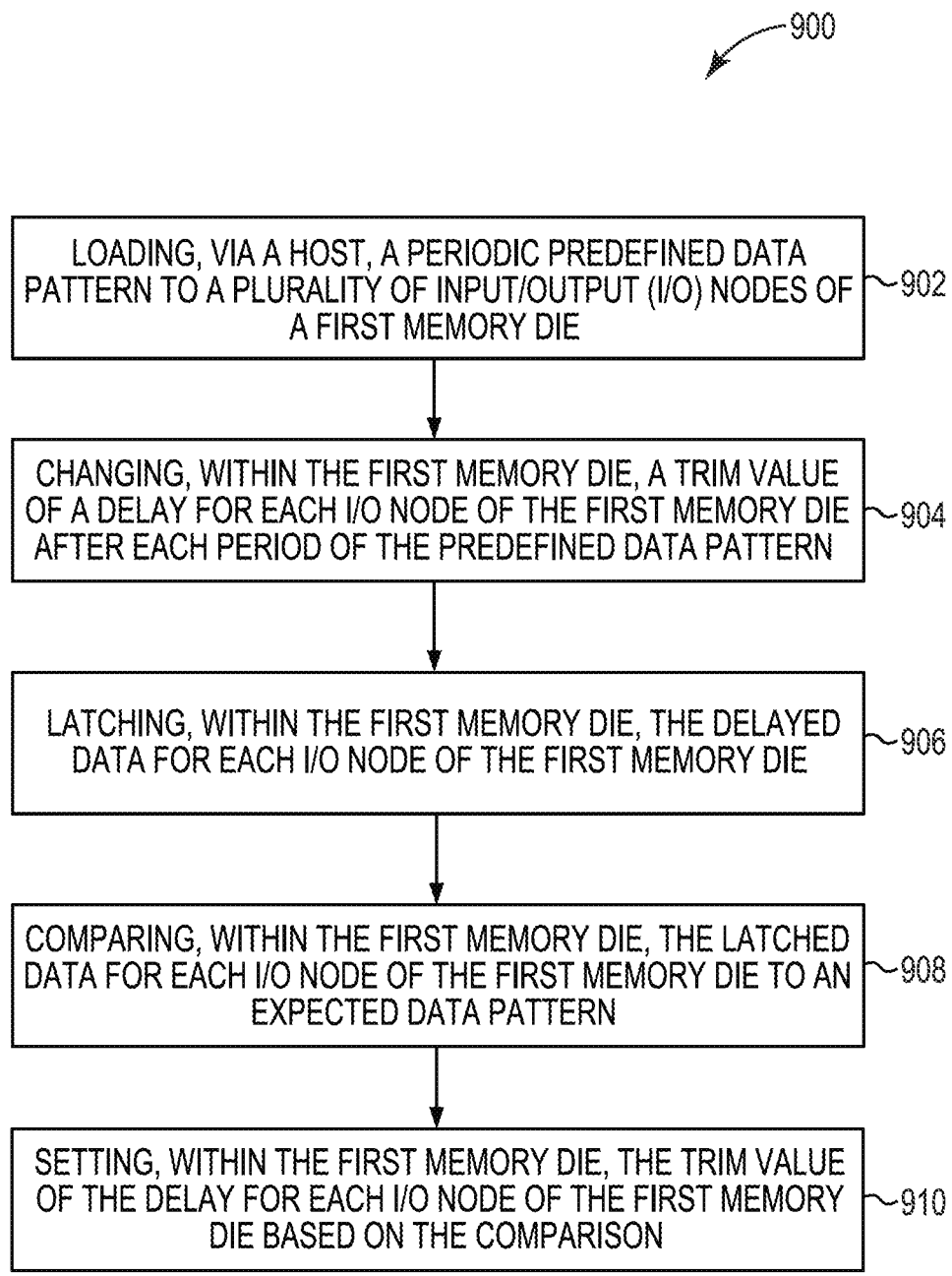
FIGS. 12A-12C are flow diagrams illustrating another embodiment of a method for write training in a memory device.
Figure 12B:
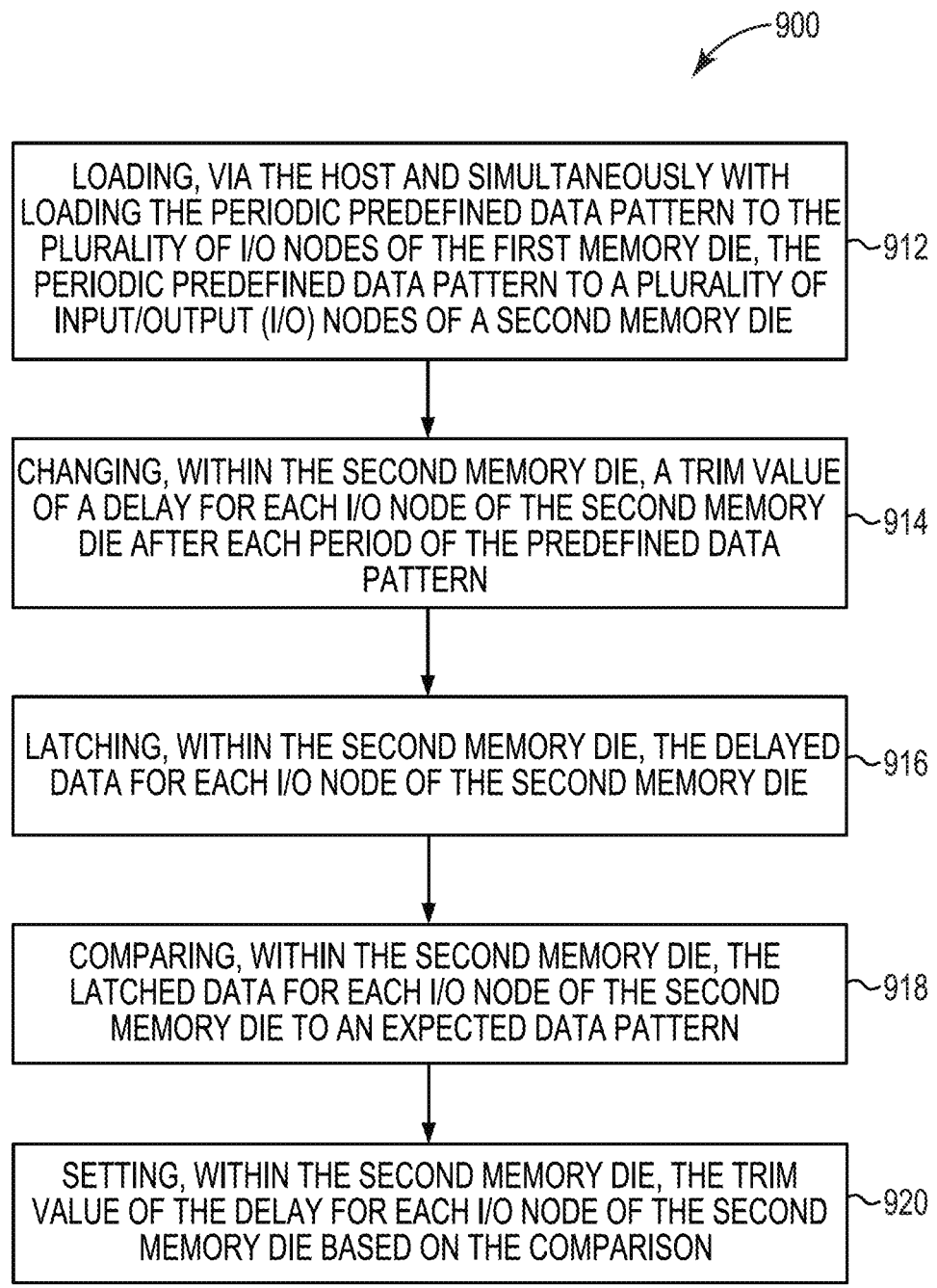
Figure 12C:
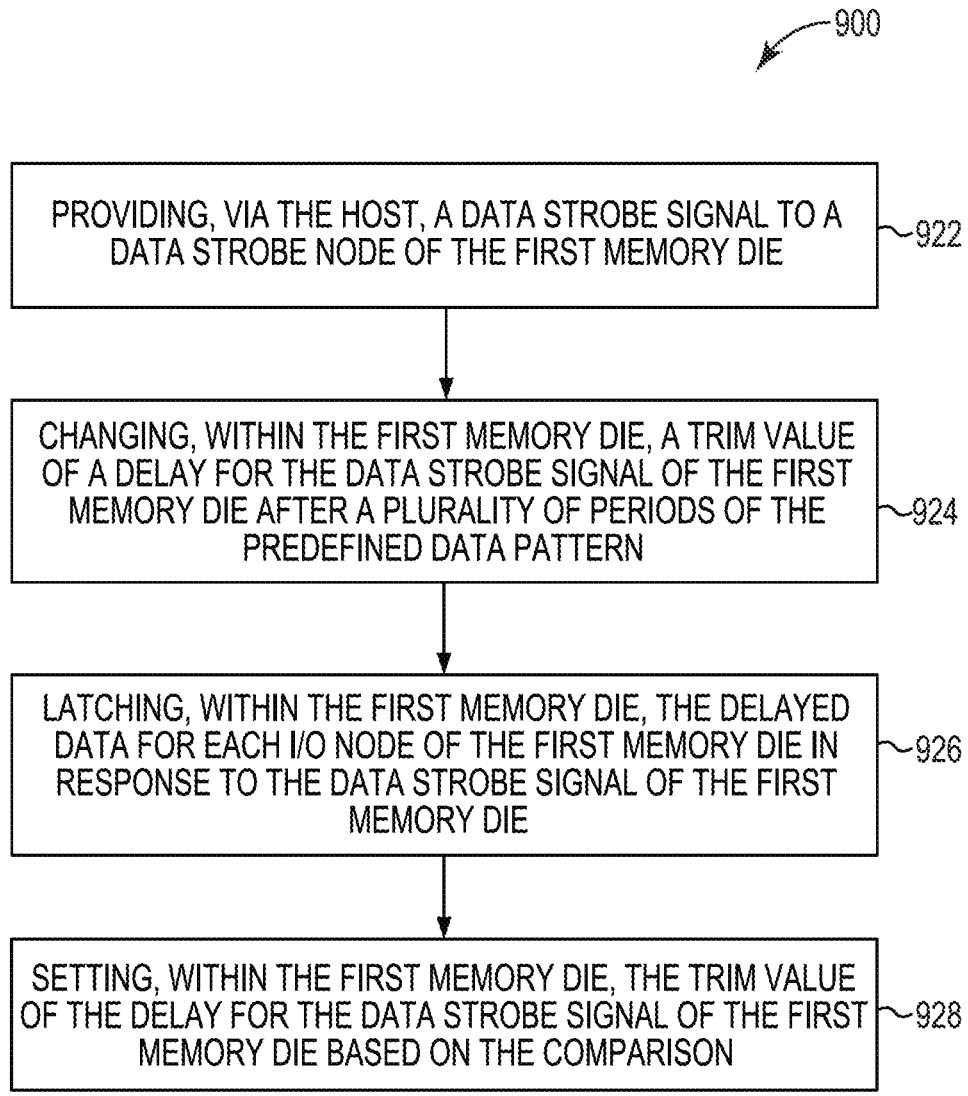

FIGS. 12A-12C are flow diagrams illustrating another embodiment of a method 900 for write training in a memory device. In one embodiment, method 900 may be implemented by system 600 of FIG. 9. As illustrated in FIG. 12A, at 902 method 900 includes loading, via a host, a periodic predefined data pattern to a plurality of I/O nodes of a first memory die. In one embodiment, the plurality of I/O nodes may equal 8 I/O nodes, and the periodic predefined data pattern may repeat every 32 bytes. At 904, method 900 includes changing, within the first memory die, a trim value of a delay for each I/O node of the first memory die after each period of the predefined data pattern. In one embodiment, changing, within the first memory die, the trim value may include incrementing the trim value after each period of the predefined data pattern with the trim value starting at 0 and ending at a predetermined trim value. At 906, method 900 includes latching, within the first memory die, the delayed data for each I/O node of the first memory die. At 908, method 900 includes comparing, within the first memory die, the latched data for each I/O node of the first memory die to an expected data pattern. At 910, method 900 includes setting, within the first memory die, the trim value of the delay for each I/O node of the first memory die based on the comparison.

As illustrated in FIG. 12B, at 912 method 900 may further include loading, via the host and simultaneously with loading the periodic predefined data pattern to the plurality of I/O nodes of the first memory die, the periodic predefined data pattern to a plurality of I/O nodes of a second memory die. At 914, method 900 may further include changing, within the second memory die, a trim value of a delay for each I/O node of the second memory die after each period of the predefined data pattern. At 916, method 900 may further include latching, within the second memory die, the delayed data for each I/O node of the second memory die. At 918, method 900 may further include comparing, within the second memory die, the latched data for each I/O node of the second memory die to an expected data pattern. At 920, method 900 may further include setting, within the second memory die, the trim value of the delay for each I/O node of the second memory die based on the comparison.

As illustrated in FIG. 12C, at 922 method 900 may further include providing, via the host, a data strobe signal to a data strobe node of the first memory die. At 924, method 900 may further include changing, within the first memory die, a trim value of a delay for the data strobe signal of the first memory die after a plurality of periods of the predefined data pattern. At 926, method 900 may further include latching, within the first memory die, the delayed data for each I/O node of the first memory die in response to the data strobe signal of the first memory die. At 928, method 900 may further include setting, within the first memory die, the trim value of the delay for the data strobe signal of the first memory die based on the comparison.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory die comprising:
a plurality of input/output (I/O) nodes to receive a periodic predefined data pattern;
a data strobe node to receive a data strobe signal;
a delay circuit coupled to the I/O nodes to delay the data received on each I/O node based on a trim value for each I/O node;
a latch coupled to the delay circuit to latch the delayed data for each I/O node in response to the data strobe signal;
a cache register to store the latched data;
a state machine to change the trim value for each I/O node after each period of the predefined data pattern is received; and
a controller to select the trim value for each I/O node based on a comparison between the stored data and an expected data pattern for each I/O node;
wherein the controller is to generate a table indicating which stored data for each I/O node for each period of the predefined data pattern matches the expected data pattern for each I/O node and which stored data for each I/O node for each period of the predefined data pattern does not match the expected data pattern for each I/O node, and
wherein the controller selects the trim value for each I/O node based on the table.

2. The memory die of claim 1, further comprising:
a deserializer coupled between the latch and the cache register to convert serial data from the latch to parallel data for storage in the cache register.

3. The memory die of claim 1, further comprising:
an XOR circuit to compare the stored data to the expected data pattern for each I/O node.

4. The memory die of claim 1, wherein the controller comprises a pattern generator to generate the expected data pattern for each I/O node.

5. The memory die of claim 1, wherein the controller selects the trim value for each I/O node to adjust the setup and hold time margin for each I/O node.

6. The memory die of claim 1, wherein the state machine is to sweep a predetermined number of trim values for each I/O node.

7. The memory die of claim 6, wherein the predetermined number equals 16.

8. The memory die of claim 1, wherein the delay circuit is coupled to the data strobe node to delay the data strobe signal based on a trim value for the data strobe signal,
wherein the state machine is to change the trim value for the data strobe signal after a plurality of periods of the predefined data pattern is received; and
wherein the controller is to select the trim value for the data strobe signal based on a comparison between the stored data and the expected data pattern for each I/O node.

9. The memory device of claim 1, wherein the controller is to compare the stored data to the expected data pattern for each I/O node to generate the table.

10. A memory system comprising:
a host to provide a periodic predefined data pattern and a data strobe signal; and
a first memory die coupled to the host, the first memory die comprising:
a plurality of input/output (I/O) nodes to receive the periodic predefined data pattern;
a data strobe node to receive the data strobe signal;
a delay circuit to adjust a delay of data received by each I/O node based on a trim value for each I/O node and to adjust a delay of the data strobe signal based on a trim value for the data strobe node;
a latch to latch the data received by each I/O node in response to the data strobe signal; and
a controller to compare the latched data to an expected data pattern and to set the trim value for each I/O node and the trim value for the data strobe signal based on the comparison;
wherein the controller is to compare the latched data to the expected data pattern to generate a table indicating which latched data matches the expected data pattern and which latched data does not match the expected data pattern, and
wherein the controller sets the trim value for each I/O node based on the table.

11. The memory system of claim 10, further comprising:
a second memory die coupled to the host, the second memory die comprising:
a plurality of input/output (I/O) nodes to receive the periodic predefined data pattern;
a data strobe node to receive the data strobe signal;
a delay circuit to adjust a delay of data received by each I/O node based on a trim value for each I/O node and to adjust a delay of the data strobe signal based on a trim value for the data strobe node;
a latch to latch the data received by each I/O node in response to the data strobe signal; and
a controller to compare the latched data to an expected data pattern and to set the trim value for each I/O node and the trim value for the data strobe signal based on the comparison.

12. The memory system of claim 10, wherein the controller generates the expected data pattern.

13. The memory system of claim 10, wherein the first memory die comprises a NAND memory.

14. A method for write training in a memory system, the method comprising:
loading, via a host, a periodic predefined data pattern to a plurality of input/output (I/O) nodes of a first memory die;

changing, within the first memory die, a trim value of a delay for each I/O node of the first memory die after each period of the predefined data pattern;

latching, within the first memory die, the delayed data for each I/O node of the first memory die;

comparing, within the first memory die, the latched data for each I/O node of the first memory die to an expected data pattern;

setting, within the first memory die, the trim value of the delay for each I/O node of the first memory die based on the comparison; and generating a table indicating which latched data for each I/O node of the first memory die matches the expected data pattern and which latched data for each I/O node of the first memory die does not match the expected data pattern;

wherein setting the trim value of the delay for each I/O node of the first memory die comprises setting the trim value of the delay for each I/O node of the first memory die based on the table.

15. The method of claim 14, further comprising:

loading, via the host and simultaneously with loading the periodic predefined data pattern to the plurality of I/O nodes of the first memory die, the periodic predefined data pattern to a plurality of input/output (I/O) nodes of a second memory die;

changing, within the second memory die, a trim value of a delay for each I/O node of the second memory die after each period of the predefined data pattern;

latching, within the second memory die, the delayed data for each I/O node of the second memory die;

comparing, within the second memory die, the latched data for each I/O node of the second memory die to an expected data pattern; and setting, within the second memory die, the trim value of the delay for each I/O node of the second memory die based on the comparison.

16. The method of claim 14, further comprising:

providing, via the host, a data strobe signal to a data strobe node of the first memory die;

changing, within the first memory die, a trim value of a delay for the data strobe signal of the first memory die after a plurality of periods of the predefined data pattern;

latching, within the first memory die, the delayed data for each I/O node of the first memory die in response to the data strobe signal of the first memory die; and setting, within the first memory die, the trim value of the delay for the data strobe signal of the first memory die based on the comparison.

17. The method of claim 14, wherein changing, within the first memory die, the trim value comprises incrementing the trim value after each period of the predefined data pattern, the trim value starting at 0 and ending at a predetermined trim value.

18. The method of claim 14, wherein the plurality of I/O nodes equals 8 I/O nodes, and
wherein the periodic predefined data pattern repeats every 32 bytes.

19. The method of claim 14, further comprising:
storing the table in a volatile memory of the first memory die.

* * * * *